(12) United States Patent
Minneman

(10) Patent No.: US 6,822,983 B2
(45) Date of Patent: Nov. 23, 2004

(54) MODULATION SYSTEM AND METHODS FOR OPTICAL SOURCE BANK

(75) Inventor: Michael Minneman, Broomfield, CO (US)

(73) Assignee: ILX Lightwave Corporation, Bozeman, MT (US)

( * ) Notice: Subject to any disclaimer, the term of this patent is extended or adjusted under 35 U.S.C. 154(b) by 158 days.

(21) Appl. No.: 10/090,714

(22) Filed: Mar. 1, 2002

(65) Prior Publication Data

US 2002/0136248 A1 Sep. 26, 2002

Related U.S. Application Data

(60) Provisional application No. 60/273,142, filed on Mar. 2, 2001, and provisional application No. 60/302,048, filed on Jun. 29, 2001.

(51) Int. Cl.[7] .............................. H01S 3/10; H01S 3/00
(52) U.S. Cl. ......................... 372/28; 372/26; 372/38.02
(58) Field of Search .......................... 372/26, 28, 38.02

(56) References Cited

U.S. PATENT DOCUMENTS 5,604,757 A * 2/1997 Liang et al. ............. 372/38.04
6,446,867 B1 * 9/2002 Sanchez ..................... 235/454
6,501,773 B1 * 12/2002 Volz et al. ............... 372/29.02
6,606,178 B1 * 8/2003 Rhee et al. ................. 398/188
2003/0095736 A1 * 5/2003 Kish et al. .................... 385/14

OTHER PUBLICATIONS

ILX Lightwave "FOM 7900B System", Rev. Mar. 4, 2002, ILX Lightwave Photonic Test & Measurement Instrumentation, Bozeman, MT., 4 pages, no month–year.

* cited by examiner

Primary Examiner—Don Wong
Assistant Examiner—Hung Tran Vy
(74) Attorney, Agent, or Firm—Lathrop & Gage, L.C.

(57) ABSTRACT

A modulation control system is used in fiber optic data transmission and fiber optic test equipment. A modulation controller includes a plurality of function generators that are linked by a switching mechanics, to a rail system that drives a plurality of laser source cards. The switching mechanism for each rail is capable of driving the rail at the function-generated waveform or switching to an external source waveform. The laser source cards are intelligent in the sense that they can be programmably controlled by switching to select waveforms from a selected one of the rails.

14 Claims, 5 Drawing Sheets

MODULATION SYSTEM AND METHODS FOR OPTICAL SOURCE BANK

RELATED APPLICATIONS

This application claims benefit of priority to U.S. Provisional Application Ser. No. 60/273,142 filed Mar. 2, 2001, and U.S. Provisional Application Ser. No. 60/302,048, filed Jun. 29, 2001, each of which is hereby incorporated by reference.

BACKGROUND OF THE INVENTION

1. Field of the Invention

The invention pertains to the field of optical source equipment and related methods for use in fiber optic communications. More specifically, the optical source equipment includes an optical source bank that is used, for example, in testing optical amplifiers and wavelength division multiplexing (WDM) systems.

2. Statement of the Problem

Rapid advances in WDM or dense wavelength multiplexing (DWDM) provide cost-effective increases in the capacity of fiber-optic data transmission systems through the use of multiple polarization orientations and multiple wavelengths of light. DWDM or dense wave division multiplexing is a higher-capacity version of WDM. WDM systems support the multiplexing of up to four channels or wavelengths on a single fiber. Commercially available DWDM systems support up to 40 wavelengths or channels, and this capacity is steadily increasing. Data transmission capacity is also increased by time division multiplexing (TDM) rates in which a plurality of separate data signals are transmitted on the same line. Maximum transmission capacity is determined as a trade-off between the DWDM channel count and the maximum supported TDM switching rate. For example, a system operating on 40 channels at OC-48 with TDM might operate at a net throughput of about 100 Gbps. Comparable future systems operating on the OC-192 protocol at 40 channels might have a net throughput of 400 Gbps, and a future system operating on 100 channels might have a net throughput of one terabit per second.

While these future systems do not yet exist, at least in terms of practical implementations, continuing advances in DWDM and TDM technology are expected to expand maximum net throughput rates over the next several years.

The advances in net throughput rates require corresponding advances in other fiber-optic system components, especially in test equipment and signal amplifiers. For example, erbium-doped fiber amplifiers (EDFA) are used in combination with DWDM systems to eliminate or minimize the use of regenerative repeaters, and can be used as in-line repeating amplifiers, transmitter booster amplifiers, and receiver pre-amplifiers. EDFA devices comprise a section of glass fiber, which is doped with erbium. Light pulsing through this section of fiber excites the erbium which, in turn, amplifies the light pulse. EDFA technology has been used, by way of example, to support a mix of four 2.5 Gbps digital video streams in delivery of an 80 channel AM cable television network signal over a 100 km distance using one EDFA at the output node and one at midspan.

Optical test equipment for use in testing system components for fiber-optic transmissions is being continually outdated in the face of rapid capacity advances. Traditional DWDM test equipment uses an eight or sixteen channel multiplexer where, for example, eight channels may be allocated to a mainframe. Attempts to provide additional sources; e.g., more than 40 laser diodes that are each linked with a corresponding channel, source modulation electronics, attenuator, polarization control, and error injection devices, produce unwieldy agglomerated test systems that are connected with a patchwork of optical cables. The test systems grow to occupy large amounts of space, and test measurement errors may be induced, for example, by movements in the optical cables that interconnect the respective devices. Depreciation and use of optical test equipment may comprise a substantial percentage, e.g., twenty or thirty percent, of the total manufacturing costs of optical system components.

With increasing densification of source bank arrays, it becomes overly expensive and complicated to provide a separate function generator for each array.

Solution

The present invention overcomes the problems that are outlined above by providing an improved modulation control system for use in optical test equipment and optical data transmission systems where there is no need to provide a separate function generator to drive each channel. This advantage is implemented through use of a rail system where each rail may be used to drive a plurality of channels based upon output from a single function generator.

The source modulation system broadly comprises a plurality of laser source channels each including a laser source card having a laser source. A modulation controller includes a plurality of function generators that are each capable of generating waveforms for use at the laser source channels. A number of rail lines connect the modulation controller with each of the laser source cards. The number of rail lines have a one-to one correspondence with the function generators. The laser source channels include a programmably controllable rail selection switch for use in switching between selected rail lines to provide a selected laser source drive input corresponding to a selected rail line. The waveforms generated on the number of rail lines are preferably selected to include at least two members of the group consisting of square waves, sawtooth waves, and sine waves.

The laser source card contains a programmably configurable switch for use in accepting a selected one of the waveforms as drive input for the laser source. The laser source card also preferably includes a gain block that is programmably configurable to adjust an amplitude of the waveform from the selected rail line, e.g., by attenuation.

The modulation controller preferably includes a number of waveform input connectors allocated to selected ones of the rail lines. Each waveform input connector is capable of receiving waveform input from an external function generator when an external function generator is connected to the waveform input connector. Each waveform input connector is also capable of providing the waveform input as output comprising an external waveform output. A corresponding number of programmably configurable waveform selection switches on the modulation controller are capable of selecting inputs between the corresponding function generator output and the external waveform output, each of the corresponding number of switches being allocated to one of the selected ones of the rail lines.

The modulation controller may also include a coherence rail system having a coherence control function generator capable of generating a coherence control waveform output and a programmably controllable coherence rail switch capable of selecting between the coherence control waveform output and a ground. In this case, the programmably controllable rail selection switch in each laser source card is capable of selecting between the coherence rail system and the shared rail systems to provide drive input for the laser source.

The modulation controller may also include a digital modulation rail system having a digital modulation function generator capable of generating a digital waveform output and a programmably controllable digital modulation switch capable of selecting between the coherence control waveform output and a ground. In this case, each laser source card includes a second switch capable of selecting between the digital modulation rail system and ground. The second switch may be configured to provide a bypass of the gain block.

The source modulation system may be used in a method comprising the step of switching the laser source card between selected rails to accept a waveform output from the selected rail for use as laser source drive input.

DETAILED DESCRIPTION OF THE PREFERRED EMBODIMENTS

Figure 1:
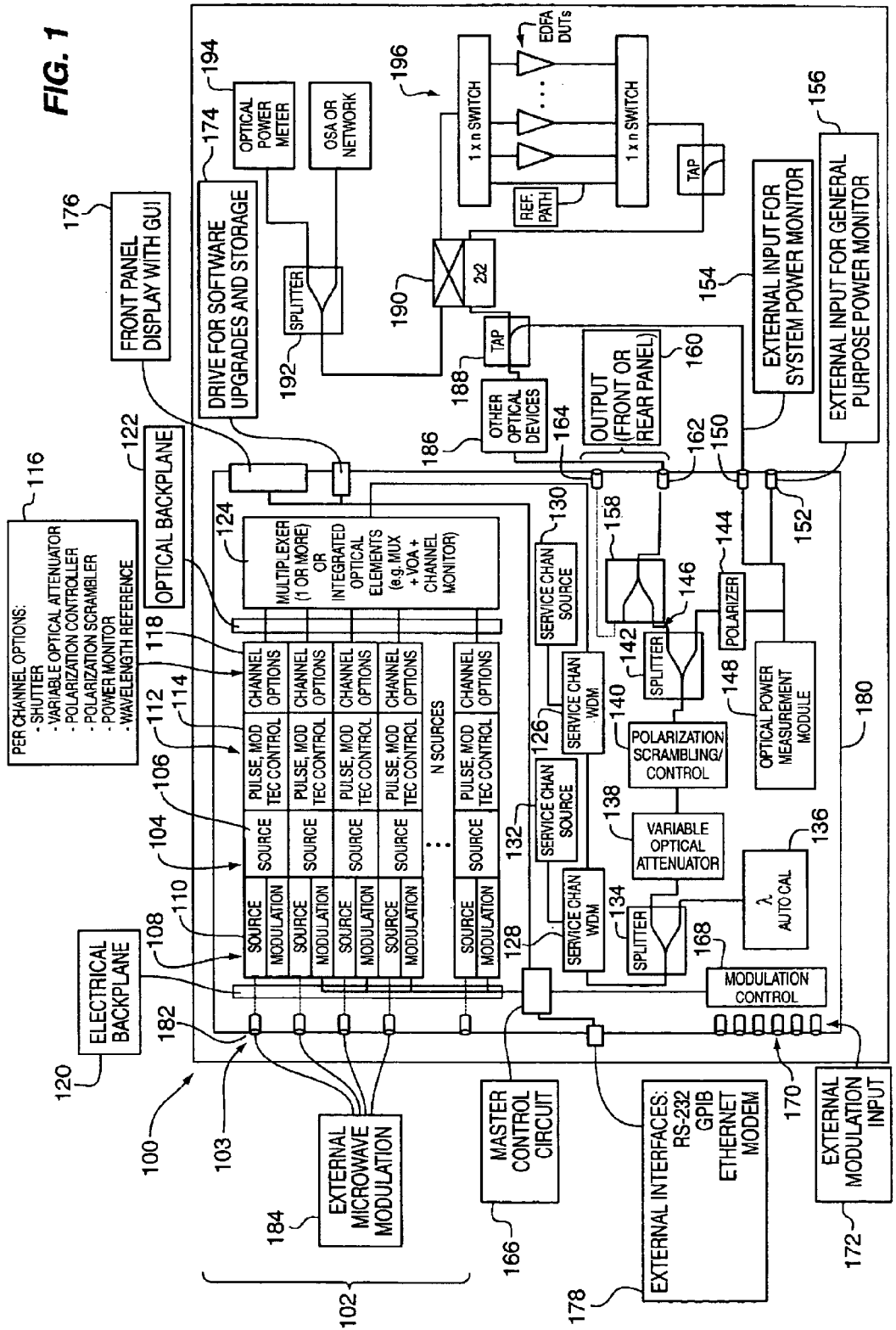
FIG. 1 is a schematic block diagram depicting an integrated modular optical test system that includes a modular laser source channel array and internal MUX that operate according to the principles described above.

FIG. 1 is a schematic block diagram of an optical test system 100 illustrating, by way of example, a modular structure that operates according to preferred principles of the invention.

An optical source array 102 is comprised of a plurality of individual channels, such as channel 103, which each contain a corresponding plurality of elements. The optical source array contains a total of N such channels, where N may be, for example, 100 or 200 channels as needed for test purposes. The optical source array, as depicted in FIG. 1, consumes less power and occupies a smaller footprint than prior devices. An additional advantage is that the array may be selectively configured to meet the demands of specific test purposes and need not be provided with too many channels. Additional channels may be selectively added or removed to meet future demands.

The individual channels of the optical source array 102 are modularly constructed to meet the needs of specific test situations. By way of example, in the optical source array 102, a laser source module bank 104 includes a plurality of individual laser source module cards, e.g., card 106 including a laser diode or any other type of optical telecommunications laser source. An example of a commercially available laser source module is the 515 module available from ILX Lightwave of Boulder, Colo. A modulation switch circuitry bank 108, e.g., comprising individual switch circuitry 110, permits selective laser modulation according to permitted system modulation functions, such as sine wave, square wave, triangular or sawtooth wave, and rectangular wave function modulations, for each laser source module card as will be described in more detail below. A thermal pulse modulation control bank 110, e.g., formed of thermal element control (TEC) circuitry 114, compensates for temperature variances in the individual laser diodes of the laser source module array 104 to provide a stable laser output. In each channel, the laser source module cards, such as card 106, preferably include the switch circuitry 110 and the thermal element control (TEC) circuitry 114 as integral components, however, the switch circuitry 110 and the thermal element control (TEC) circuitry 114 may be provided as separate modular cards with compatible plug-in connectors.

A channel option array 116 comprising individual channel option cards, such as card 118, may be selectively added using commercially available components to provide shutter control for each laser, a variable optical attenuator, a polarization controller a polarization scrambler, a power monitor, and a wavelength reference. These devices may be used individually, selectively combined in series, or not used at all, depending upon test needs.

In cases where the channel option card 118 is a power monitor card, it is preferred to use a tap coupler, e.g., a 99%/1% coupler where power measurement is made on the 1% tap. Prior power monitor devices monitor current at a laser chip on the laser source card and use this measurement to stabilize the power output of the laser. Prior techniques are, therefore, only sensitive to effects on the laser that can affect the power stability, however, these techniques are insensitive to power changes that derive from changes in the other optical and circuitry elements that are connected to the laser. Placing a power monitor downstream of the laser in the position of card 118 advantageously permits monitoring and/or selective adjustment of laser power output based upon the total channel laser power output.

Where, for example, the channel option card 118 is a polarization controller or polarization scrambler, the card operates upon polarized light from the laser source card 106 to align polarization in a controlled manner to optimize external modulation power and to control polarization dependent dispersion and polarization-dependent loss. A polarization scrambler generates all states of polarization in a certain time interval, which averages out polarization-dependent effects. By way of example, commercially available device that can be used as both a polarization alignment device and a polarization scrambler is, by way of example, the model PCS-3X-PC/APC-7 which is available from General Photonics.

Where, for example, the channel option card 118 is a wavelength reference, or wavelength lock an optical filter and power meter provide feedback that measure and stabilize the laser frequency from the laser source card 106. The feedback signal is derived using the intensity or phase of light that is reflected from or transmitted to the filter.

Where, for example, the channel option card 118 is a shutter, the shutter mechanism, such as a mechanically actuated fiber switch in a V-groove mount, is preferably used to disrupt or transmit laser emissions from the laser source card 106 without having to change the current at the laser. This ability avoids the necessity of deenergizing and reenergizing the laser, which requires a long settling time to stabilize laser emissions upon reenergization. By way of example, commercially available shutter devices include the model FOSW 1-1-L-PC-L-1 shutter from Lightwave Link, which has a 50 ms switching time.

Where, for example, the channel option card 118 is a variable optical attenuator, such as the OZ Optics model DD-100-11-1550-9/125-S-40-3D3S-1-0.5-485:1-6-MC\SPI, the attenuator is used to reduce the intensity of light in the channel 103 to much lower and stable power levels than the laser source card 106 can achieve alone with a reduction in current. The individual channel attenuator reduces the power level of the channel for whatever level is needed for the system under test combined comb using one device before the comb is delivered to a system under test.

Each channel in the optical source array 102 shares a common optical backplane 120 and a common electrical backplane 122, which respectively provide compatible electrical or optical couplings that mate with corresponding couplings on the individual channels. The specific manner of connectivity is not critical, so long as the connectors provide the optical and electrical pathways that are required for module compatibility with the optical test system 100.

An optional but preferred multiplexer (MUX) 124 combines the individual channel emissions from the optical source array 102 to provide a combined comb including the combined emissions. For example, a commercially available MUX is the model AWG-NG-48×1-100G-1.5—FC/APC from SDI PIRI. The creation of a wavelength comb within a single instrument advantageously facilitates operations on the combined comb within the test system 100, as opposed to prior techniques requiring a separate device that occupies an additional footprint. Comb operations are, accordingly, simplified and expanded, as a single programmable controller is enabled to direct these functions in amore versatile manner than could be obtained from separate devices. An additional advantage is that fiber management and integrity is controlled within the enclosure of test system 100, which reduces set-up time and the risk of fiber damage.

The optical pathway proceeds from the multplexer 124 to a series of optional modular service channel WDM processors 126 and 128, which are coupled with corresponding service channel sources 130 and 132 for conventional data transmission signal processing, e.g., for WDM-TDM handshake recognition relating to endpoint interpretation of the channels in the combined comb.

A beam splitter 134, e.g., a 99%/1% splitter, provides light from the combined comb to an auto-calibration device 136, which includes an optical filter and power meter that provide feedback for measurement and stabilization of the laser frequency. The feedback signal is derived using the intensity or phase of light that is reflected from or transmitted to the filter at emission wavelengths corresponding to the design wavelengths for the channels of laser source array 104. Power control of individual laser source cards in the laser source array 104 may, thus, be regulated after MUX processing to form a combined comb.

An optional variable optical attenuator 138, such as the OZ Optics model DD-100-11-1550-9/125-S-40-3D3S-1-0.5-485:1-6-MC/SPI, operates on the combined comb downstream of MUX 124 reduce the intensity of light in the combined comb to much lower and stable power levels than the laser source array 104 can achieve alone with a reduction in current. The individual channel attenuator reduces the power level of the channel for whatever level is needed for the system under test .combined comb using one device before the comb is delivered to a system under test.

A polarization controller or polarization scrambler 140 operates upon the combined comb downstream of MUX 124 to align polarization in a controlled manner to optimize external modulation power and to control polarization dependent dispersion and polarization-dependent loss. A polarization scrambler generates all states of polarization in a certain time interval, which averages out polarization-dependent effects and identifies minimum and maximum transmission orientations. By way of example, a commercially device that can be used as both a polarization alignment device and a polarization scrambler is the model PCS-3X-PC/APC-7, which is available from General Photonics.

A splitter 142 divides the optical pathway for the combined comb into a polarized output segment leading to polarizer 144 and a non-polarized segment 146. The segment leading to polarizer 144 is in optical communication with an optical power measurement module 148, which monitors the power output in the combined comb at different polarization states. Optical connectors 150 and 152 are present to receive optical input from other sources external to the optical test system 100, such as a system power monitor 154 or a general-purpose power monitor 156.

The non-polarized segment 146 is advanced by a splitter 158 or a series of such splitters leading to an output panel 160 including a plurality of optical connectors 162 and 164. The panel 160 may be provided on the front or rear of the optical test system 100, or two or more such panels 160 may be present on both the front and rear or the sides.

The foregoing discussion has focused primarily upon the optical pathway within the optical test system 100, and the discussion of electronics has until now not included a discussion of the control circuitry. A master control circuit 166 includes a central processing unit, magnetic or optical data storage, random access memory, and program logic, as required to interact with other system components of the optical test system 100 during normal system control operations in the intended environment of use. For example, the master control circuit may comprise a conventional motherboard for a personal computer, as well as any other circuitry and data storage devices that are commonly used with computers. A modulation control module 168 is provided to drive laser source emissions from the laser source array 106 according to standard WDM-TDM practices. The modulation control module 168 may also be incorporated as part of the master control circuit 166. The modulation control module 168 is provided with a plurality of connectors, such as connector 170, for use in coupling with an external modulation input source 172. These connectors may be optical or electrical connectors, and the number of connectors corresponds to the number of modulation options in the optical source array 102. Thus, the external modulation input source 172 may be configured to drive modulation of the optical source array 102 in a manner that is not provided for by the electronics in the modulation control module 168.

The electronics on modulation control module 168 include a function generator that accepts instructions from the master control circuit 166 to drive individual elements (e.g., laser source card 106) of the laser source bank 104 in a predetermined manner that is compatible with conventional WDM-TDM practices. This function generator may be switched to an OFF mode to accept external inputs. In an ON mode, the function generator provides sine waves, triangular or sawtooth waves, square waves, and any other wave form that is known or useful to those skilled in the art. The modulation depths are selectively adjustable from 0 to 100%. The modulation control module preferably provides signals comprising a plurality of these waveforms to each channel in the optical source array 102, and individual channels are intelligent in the sense that they are programmed by instructions from the master control circuit 166 to accept one of the provided waveforms to energize the laser.

An optical or magnetic disk drive 174, such as a Zip drive, is used to provide software upgrades to the master control circuit 166, as well as to log the performance of optical test system 100. These functions may also be accomplished using a modem or network connection to an appropriate server, e.g., an Internet server, or other suitable terminus.

A front panel display 178, e.g., a 10" color liquid crystal display or plasma display panel, provides a graphical user interface showing all of the source channels in the optical source array 102, their emission power levels, and the emission wavelengths. An intuitive command set is provided for interaction with the master control circuit 166 to allow rapid modifications to the system setup. Single source commands are provided to adjust the properties of individual lasers on each channel. Comb commands are provides to adjust the properties of the complete comb. Modulation functions are provided to adjust the operation of the modulation control module 168.

The optical test system is compliant with any number of data transmission protocols that are commonly used in networking and optical test systems. External interfaces 178 exist for connections to other devices that use these protocols, such as RS-232, GPIB, and Ethernet. Furthermore, these interfaces preferably include a modem connection for either an internal or external modem, which interfaces with the manufacturer of optical test system 100 for trouble shooting purposes. The modem may also provide real-time test measurement data summaries to remote locations or a telephony network.

Except for those components that are specifically noted above as being external to the optical test system 100, all of the system components that have previously been described are preferably internal to a single box 180, and are provided as modular cards or boards that may easily be replaced or renewed on a component by component basis. This feature provides an extremely compact modular system that occupies a small footprint and can be upgraded for small incremental costs over a period of many years.

External optical and electrical systems can also be provided for use in combination with the optical test system 100. For example, each channel in the optical source array 102 is preferably provided with an optical connector, such as connector 182, that accepts a fiber optic coupling for connection with an additional optical source system, such as an external microwave modulation system 184, which may, for example, be an optical test mainframe. In this manner, additional sources may be combined into the comb that is processed through MUX 124.

Similarly, external optical devices may be provided downstream of the optical test system 100, e.g., a generic device 186, with power measurements being obtainable at any point from the downstream pathway by a simple tap, such as tap 188, for feedback to the optical power measurement module 148 through one of connectors 150 or 152. Further splitters, such as 2×2 splitter and 1×1 splitter 192 may be used as needed to branch the optical pathway to other equipment 194, which may include measurement systems such as power meters and the like, or it may branch to open system architecture or networks. Other pathway branches, for example, lead to test equipment, which may include 1×N switches for the testing of, for example, erbium doped fiber amplifiers (EDFA) or other DWDM system components.

Figure 2:
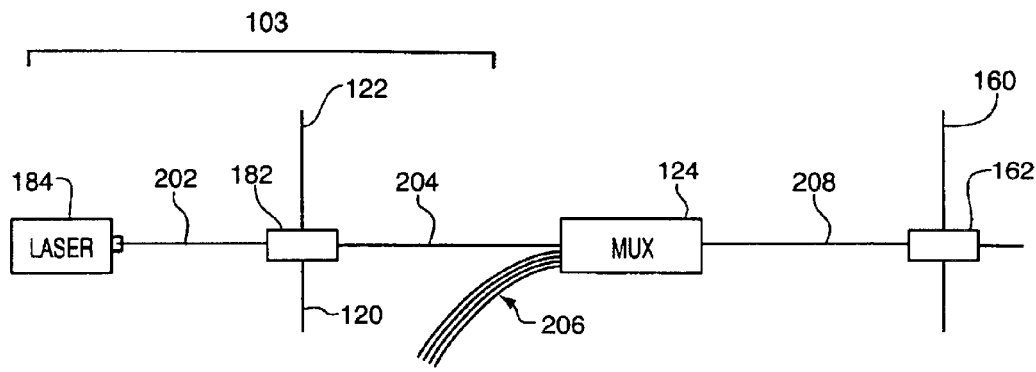
FIG. 2 depicts an optional channel configuration for the optical test system, wherein a fiber bundle provides input to the MUX.
Figure 3:
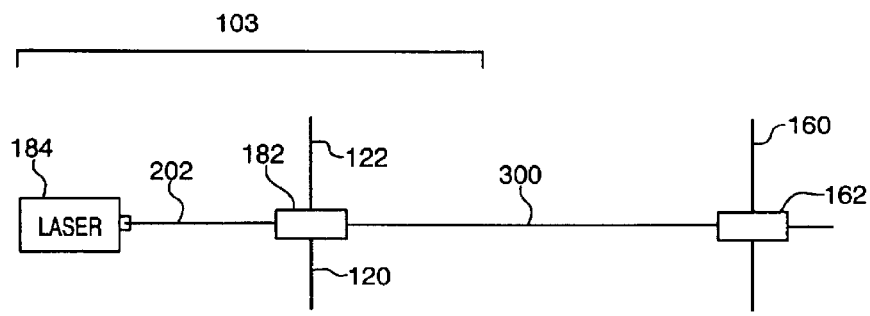
FIG. 3 depicts another optional channel configuration for the optical test system, wherein an optical fiber bypasses the MUX.
Figure 4:
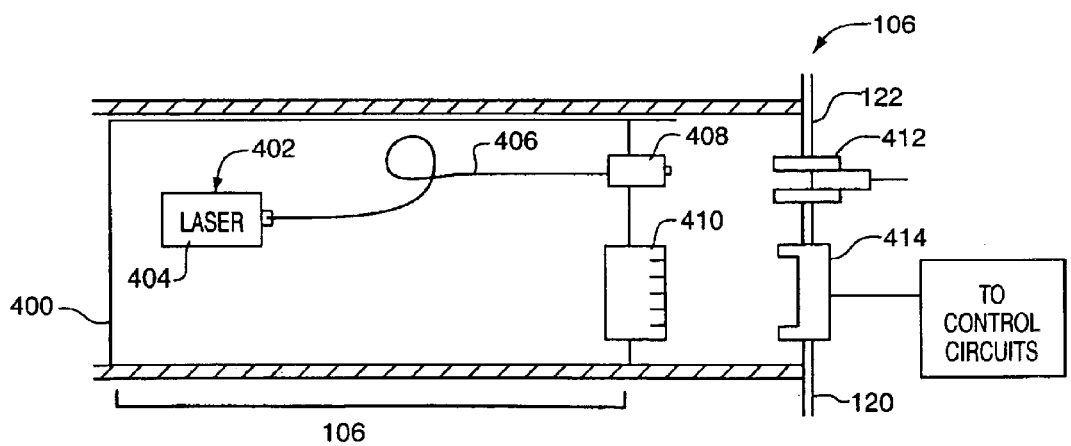
FIG. 4 depicts yet another optional channel configuration for the optical test system, wherein a laser source card couples with a corresponding optical coupling and an electrical bus.

FIGS. 2-4 provide additional detail concerning optional configurations for use of the individual channels, e.g., channel 103, of the optical source array 102 In FIGS. 2-4, like numbering has been retained with respect to identical elements that are shown in the FIG. 1 schematic diagram, however, the configurations differ in a user-determined manner.

FIG. 2 depicts the optical source array being fed by a laser source channel 103. A first pathway segment 202 within channel 103 feeds laser output to optical coupling 182, which resides in the electrical/optical backplane 122. In turn, a second fiber optic cable 204 feeds MUX 124, which also accepts a fiber optic bundle 206 to provide a combined comb output to fiber optic cable 208. In turn, fiber optic cable 208 feeds optical coupler 162 in the output panel array 160. In this embodiment, the optical elements 128 through 158 are not required and may be either absent in optical test system 100 or bypassed by a patch cable. The pathway segment 202 may include one or more channel option cards, such as a shutter, variable optical attenuator, polarization controller, polarization scrambler, power monitor or wavelength reference card, as described in the context of channel option bank 118 in FIG. 1.

FIG. 3 shows a configuration that is identical with respect to FIG. 2, except the MUX 124 is absent in FIG. 3. A bypass cable 300 travels directly to the connector 162 in the output panel array 160.

FIG. 4 depicts insertion of a laser source module card 106 into channel 103. The laser source module card 106 contains a printed circuit board 400, which has compatible electronics for modulation of a laser source 402, such as a laser emitting diode 404, which is coupled with fiber optic cable 406 leading to a plug-in optical connector 408. The printed circuit board 400 also has an electrical bus 410, such as a PCI buss. The optical coupler 408 and the bus 410 mate with corresponding receptacles 412 and 414 in the electrical/optical backplane 122 for the transmission of electrical and optical signals. The channel option cards (not depicted in FIG. 4), such as channel option card 118 shown in FIG. 1, may be daisy-chained with the laser source card 106 by opposite pairs of electrical buses and optical connectors that are identical to the optical coupler 408, the bus 410, and receptacles 412 and 414

Figure 5:
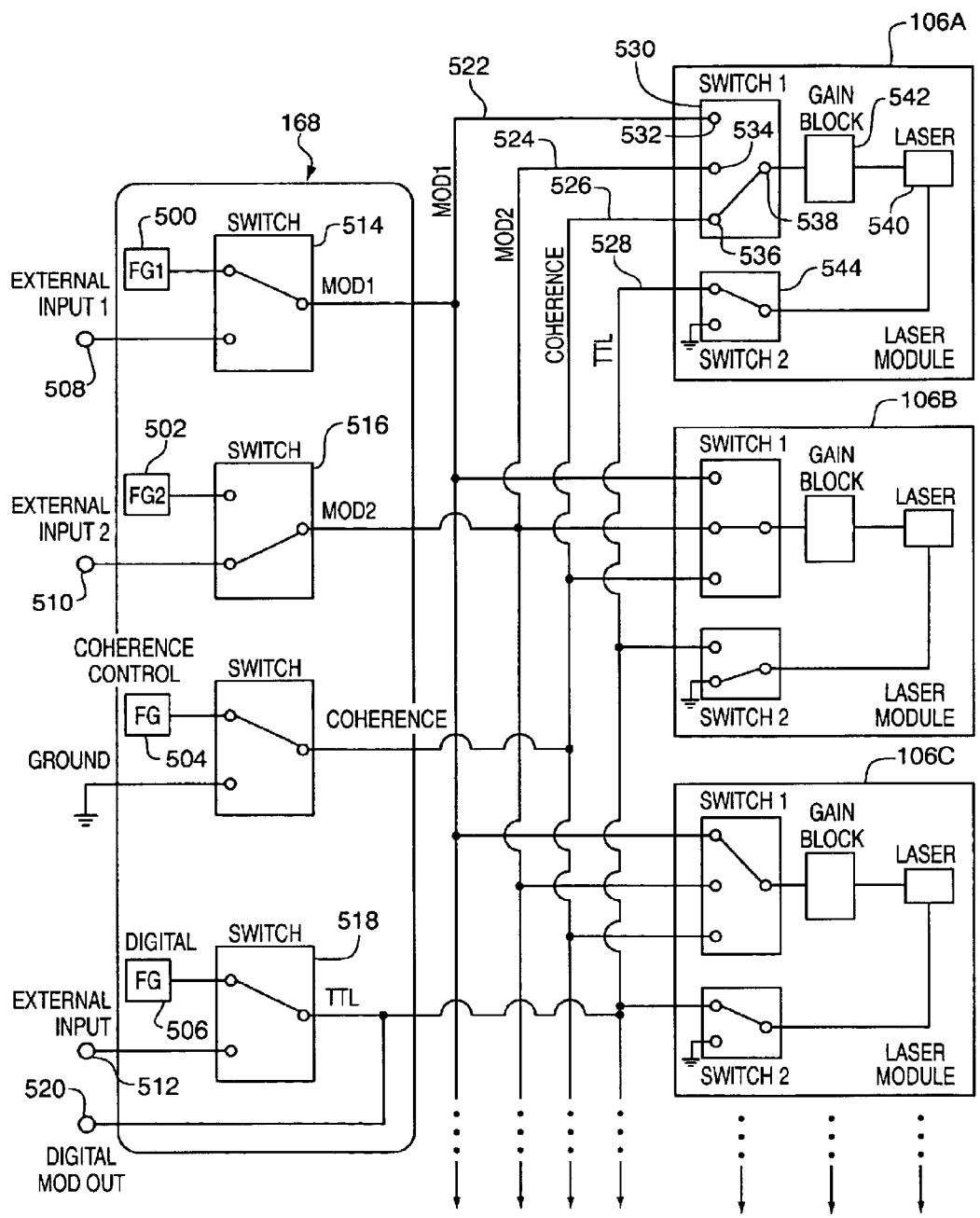
FIG. 5 is a circuit schematic depicting a modulation controller and connections to an array of laser source cards that are used for waveform switching operations that provide selected waveforms to drive a plurality of laser sources from a common rail system.

FIG. 5 is a circuit diagram that schematically depicts switching logic in the electronics of the modulation control module 168 and a plurality of laser source module cards, such as card 106, which are denoted in FIG. 5 as cards 106A, 106B, and 106C.

Within the modulation control module 168, there exist a plurality of function generators 500, 502, 504, and 506. The function generators 500 and 502 are program configurable to generate any type of waveform, such as a sine, square, or triangular waveform, that may be useful in the optical test system 100. The function generators 500 and 502 are normally programmed to generate signals that differ from one another as, for example, sine waves and square waves. Function generator 504 provides what is commonly known as a coherence control sine wave, which incorporates a I GHz line width in the laser emission. Function generator 506 is a digital function generator that switches between full on and full off. The amplitude of signal modulation provided from the respective function generators is +/−1V for a peak-to-peak amplitude of 2V. A number of external source inputs from the external source input array 170 (see FIG. 1) provide an option for bypassing the function generators 500–506, except the function generator 504 does not necessarily need a bypass. Thus, programmably controlled switches 514, 516 and 518 permit a user to configure each channel of the optical source array 102 (see FIG. 1) for use with an integral function generator or an external waveform source. The coherence control signal may be turned on or off by switching to ground. A digital modulation output jack 520 is provided to permit synchronization of signal timing between multiple interconnected optical test systems 100.

Output from the various waveform sources travels on dedicated lines or rails, such as line 522 for modulation 1, line 524 for modulation 2, line 526 for coherence, and 528 for TTL digital switching. Each of laser source cards 106A to 106C is connected to the lines 522–528 in an identical manner, which is described herein in reference to card 106A. A programmably controlled switch contains three terminals 532, 534 and 536, which are respectively connected to corresponding lines 522, 524 and 526. A switching terminal is selectively connected to one of the three terminals 532–536 for modulation of a laser diode 540 according to the waveform on the corresponding one of lines 522–526. As shown in the case of card 106A, this connection is between terminal 536 and line 526. A programmably controlled gain block 542 is used to attenuate the amplitude of the waveform to a peak-to-peak value less than the 2V peak-to-peak value on the corresponding one of lines 522–526. A second switch 544 is used to modulate the laser diode 540 at full amplitude using digital switching with bypass of the gain block 542. As shown in the case of card 106A, switch 544 is set to enable digital switching, which deactivates modulation from switch 530. Alternatively, switch 544 could be switched to ground, in which case modulation from terminal 536 and line 526 would be enabled.

Figure 6:
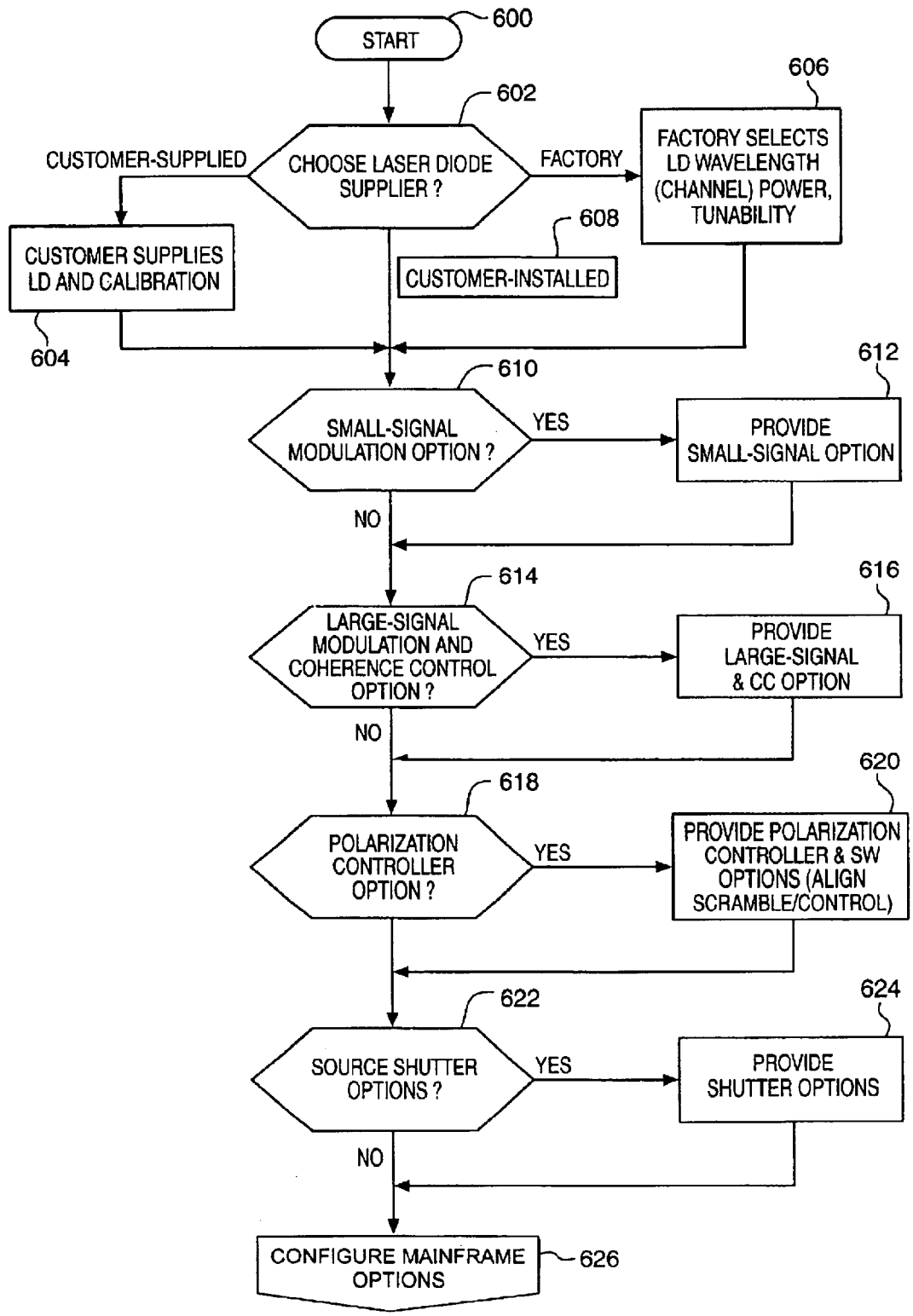
FIG. 6 is a process flow diagram illustrating a method of making the optical test system.

FIG. 6 depicts a flow chart that represents the various setup configuration options for optical test system 100. Except as noted below, this setup is performed at the factory prior to delivery of the optical test system 100 to the customer. In step 600, the system is provided as an empty box that requires various modules to be installed according to a customer's test needs. A decision is made in step 602 as to the source of laser diodes for the laser source bank 106. This decision has three options. The customer can supply precalibrated diodes for factory installation in step 604. The factory can install a recommended array, e.g., for specific DWDM test applications, in step 604, or nothing is installed so that the customer can install the diodes in step 608.

A decision is made in step 610 whether to install a small signal modulation option. If yes, then in step 612 a modulation control module 168 is installed that permits modulation to signal depths ranging from 0 to 100%. If no, the modulation control module 168 is installed without this option. These options may be provided as an add-on board or chip in a standard modulation control module. Similarly, a decision is made in step 614 whether to install a large signal modulation and coherence control option. If yes, then a modulation control module 168 is installed in step 616 with these options enabled. If no, the modulation control module 168 is installed without this option.

A decision is made in step 620 whether polarization control should be installed. If yes, then channel option card, such as card 118, is installed to provide this function in step 620.

This process is repeated for all of the optional modular system components that are shown in FIG. 1. For example, a decision is made in step 622 whether a source shutter will be installed as one of the channel options for card 118. If yes, then the shutter option card is added to one or more channels of the optical source array 102 in step 624. This pattern may be repeated for the MUX 124, as well as the optical system components 128 through 158, according to customer specifications. Accordingly, it is seen that the modularity of optical test system 100 permits factory setup and calibration in a manner that could not be obtained from prior test systems, which typically are assembled at the test site by the customer and may include components from different manufacturers that may have numerous incompatibilities. The factory setup also eliminates test measurement errors due to erroneous, poor or non-optimized installation of system components, and the inclusion of modules within a single system permits on-line factory diagnostics through use of a modem in the external interfaces 178. Furthermore, soft patches for system upgrades and new drivers may be added to the modular system through use of the data storage drive 174.

Figure 7:
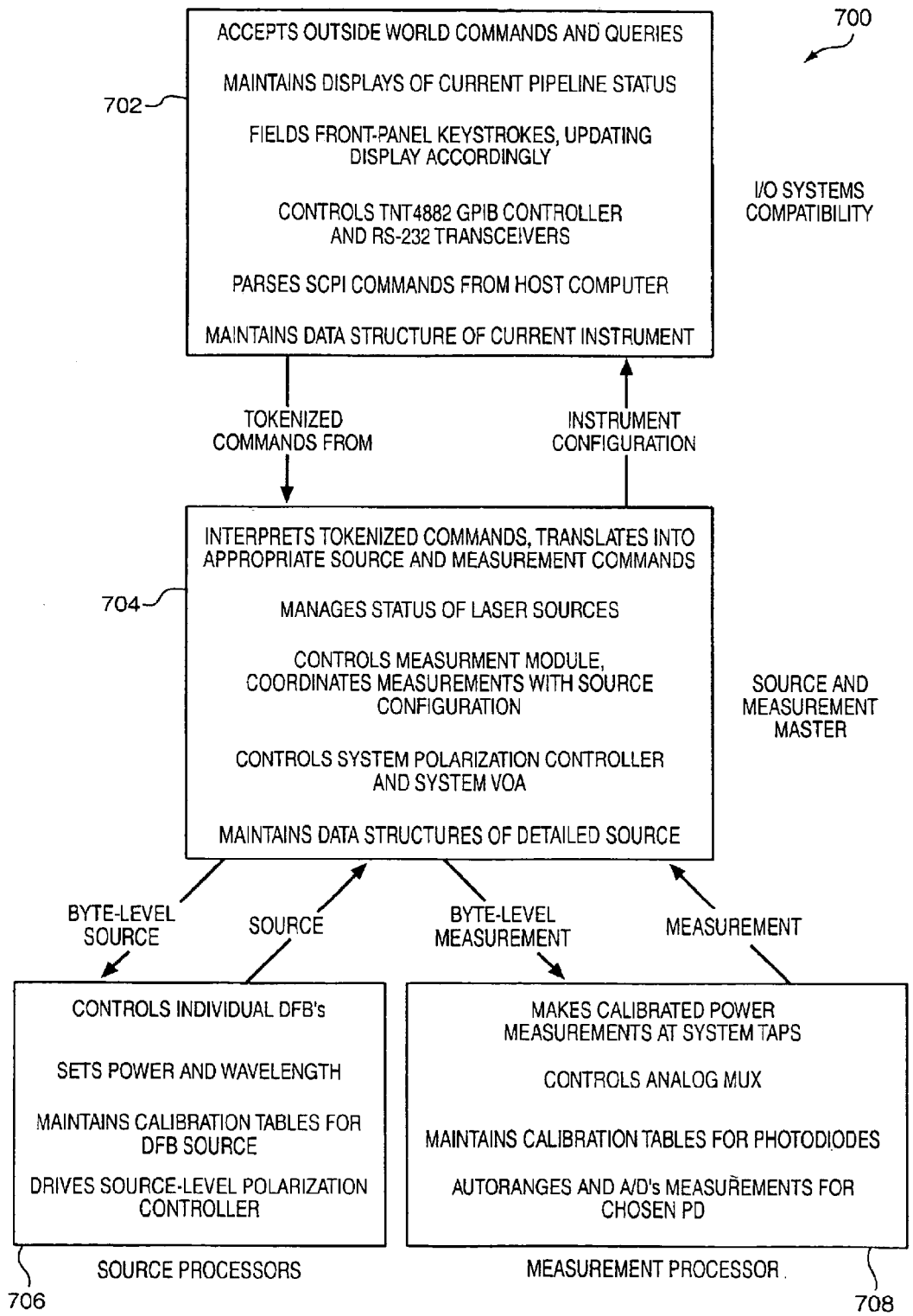
FIG. 7 is a block functional diagram illustrating aspects of firmware that is used to program the optical test system.

FIG. 7 depicts a block diagram of preferred firmware functionality within optical test system 100. This functionality is executed by program instructions in the master control circuit 166. Block 702 lists various input/output functions. The system accepts outside commands and functions, for example, as directed by a controller for the external microwave modulation source for synchronization of the optical source array 102. Block 702 maintains a display on the front panel display 176 denoting the current comb or pipeline status for each channel. Block 702 also interprets or fields keystrokes from the front-panel display and updates the display according to these keystrokes. Block 702 also controls the GPIB controller, e.g., a TNT 4882 controller, and the RS 232 transceiver, as described in connection with the external interfaces 178. Block 702 also parses SCPI commands from a host computer, which may be part of the master control circuit 166 or a remote processor on a network. Block 702 also maintains the current data structure of the optical test system 100.

Block 704 represents source and measurement functionality. Block 704 interprets tokenized commands that are passed from block 702 by translating these commands into corresponding source code and measurement commands. Block 704 manages the status of the laser sources in each channel of the optical source array 102. Block 704 also creates and controls a measurement module wherein the output of the respective channels may be coordinated with measurements obtained from the channel output, such as power measurements obtained from the channel option bank 116 or test measurements obtained from the test equipment 196 when such measurements can be allocated back to a particular channel or source. Block 704 additionally controls other devices in the optical pathway of optical test system 100, such as polarization controllers or scramblers. Block 704 maintains the data structure of each channel, as needed for channel configuration and passes instrument configuration information to block 702.

Block 706 pertains to control functions for the laser source cards, such as card 106, which each may be provided with their own processor. Block 706 interacts with block 704 by receiving byte-level source code and transmitting source status information. Block 706 uses the byte-level source to control energization of the individual laser diodes or DFB's. Block 706 set the power and wavelength of the laser emission according to limits that are within predetermined system specifications. Block 706 maintains calibration tables for each laser source, and it drives a source-level polarization controller, as will be explained in more detail below.

Block 708 pertains to measurement processor functions, which may include calibrated optical power measurements at system taps, such as may be measured through the optical power measurement module 148 or the channel option bank 116. Block 708 controls the MUX 124, which may from time to time require servo adjustment of optical components in the case of a tunable MUX. Block 708 maintains calibration tables for photodiodes that are used in obtaining optical measurements. Block 708 autoranges and adjusts measurements for a chosen photodiode.

Due to the densification of the channel source array 102, as made possible by the concepts discussed above, temperatures within the housing may rise in comparison with respect to less dense sources. The increased temperatures are associated with temperature dependant effects upon the system electronics. These effects could ostensibly result in test measurement variances unless the system electronics accommodate these variances. Accordingly, a new method of cooling the laser diodes has been devised, which includes a switch-mode bi-directional control of laser diode temperature.

The circuitry is preferably located in the laser source cards, such as laser source card 106, and includes a thermoelectric controller having a Peltier junction between a first junction conductor and a second junction conductor. A switch-mode DC power supply is electrically connected to the first junction conductor and the second junction conductor for flowing DC electrical current across the Peltier junction. The thermoelectric coupler operates as a heater when current flows in one direction and a cooler when current flows in the other direction. The thermoelectric controller is heat-conductively connected to the laser diode on the laser source card. The master controller 166 or other control logic integral to the laser source card uses measurements from a temperature sensor to switch the DC current direction in maintaining the temperature of the laser diode within a preferred operating range additional information concerning the thermoelectronic controller may be found in provisional application serial No. 60/272,997 filed as a provisional application on Mar. 2, 2001, which is hereby incorporated by reference to the same extent as though fully repeated herein.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventors hereby state their intention to rely upon the Doctrine of Equivalents in protecting the full scope and spirit of the invention.

What is claimed is:

1. A source modulation system for use in optical data transmission systems and optical data test components, comprising:

a plurality of laser source channels each including a laser source card having a laser source that generates laser output with adjustable signal modulation depth, the laser source channels including a programmably controllable rail selection switch for use in switching between selected rail lines to provide a selected laser source drive input corresponding to a selected rail line;

a modulation controller including a plurality of function generators that are each capable of generating waveforms for use at the laser source channels; and a shared rail system connecting the modulation controller with each of the laser source channels, the shared rail system including a number of rail lines each connecting the modulation controller with the laser source cards, the rail lines being equal in number to the function generators on the modulation controller.

2. The source modulation system of claim 3, wherein the modulation controller includes a number of waveform input connectors allocated to selected ones of the rail lines, each waveform input connector being capable of receiving waveform input from an external function generator when an external function generator is connected to the waveform input connector and providing the waveform input as output comprising an external waveform output, and a corresponding number of programmably configurable waveform selection switches capable of selecting inputs between the corresponding function generator output and the external waveform output, each of the corresponding number of switches being allocated to one of the selected ones of the rail lines.

3. The source modulation system of claim 1, further including a coherence rail system in communication with each of the laser source cards, the coherence rail system having a coherence control function generator capable of generating a coherence control waveform output and a programmably controllable coherence rail switch capable of selecting between the coherence control waveform output and a ground.

4. The source modulation system of claim 3, wherein the programmably controllable rail selection switch in at least one laser source card is capable of selecting between the coherence rail system and the shared rail systems to provide drive input for the laser source.

5. The source modulation system of claim 3, wherein the modulation controller includes a digital modulation rail system including a digital modulation function generator capable of generating a digital waveform output and a programmably controllable digital modulation switch capable of selecting between the coherence control waveform output and a ground.

6. The source modulation system of claim 5, wherein at least one laser source card includes a second switch capable of selecting between the digital modulation rail system and ground.

7. The source modulation system of claim 6, wherein the laser source card includes a gain block for adjusting an amplitude of waveforms from the shared rail system to adjust the modulation depth of the laser output, and wherein the second switch provides a bypass of the gain block.

8. The source modulation system of claim 1, wherein the function generators are operable to produce on the number of rail lines waveforms selected to include at least two members of the group consisting of square waves, sawtooth waves, and sine waves.

9. The source modulation system of claim 1, wherein at least one of the laser source cards contains a programmably configurable switch for use in accepting a selected one of the waveforms as drive input for the laser source.

10. The source modulation system of claim 9, wherein the laser source card includes a gain block that is programmably configurable to adjust an amplitude of the selected waveform, to adjust the modulation depth of the laser output.

11. The source modulation system of claim 10, wherein the gain block operates by attenuating the amplitude of the waveform.

12. The source modulation system of claim 10, wherein the laser source card includes a bypass mechanism that is programmably configurable to bypass the gain block.

13. The source modulation system of claim 1, comprising a mechanism for accepting external sources to drive modulation input for each of the laser source channels.

14. The source modulation system of claim 13, wherein the mechanism comprises signal input connectors having a one-to one relationship with the number of channels.

* * * * *